United States Patent [19]

Asakawa et al.

[11] Patent Number: 5,248,886
[45] Date of Patent: Sep. 28, 1993

[54] PROCESSING SYSTEM

[75] Inventors: Teruo Asakawa, Yamanashi; Tetsu Osawa, Sagamihara; Noboru Hosaka, Yamanashi, all of Japan

[73] Assignee: Tokyo Electron Limited, Tokyo, Japan

[21] Appl. No.: 842,421

[22] Filed: Feb. 27, 1992

[30] Foreign Application Priority Data

Mar. 1, 1991 [JP] Japan .................................. 3-62660

[51] Int. Cl.$^5$ ............................................. H01J 37/20
[52] U.S. Cl. ........................ 250/442.11; 250/492.21
[58] Field of Search ............... 250/441.11, 442.11, 250/492.2, 492.21

[56] References Cited

U.S. PATENT DOCUMENTS

| | | | |
|---|---|---|---|
| 4,433,951 | 2/1984 | Koch | 250/441.11 |
| 4,553,069 | 11/1985 | Purser | 250/442.11 |
| 4,700,077 | 10/1987 | Dykstra et al. | 250/441.11 |
| 4,705,951 | 11/1987 | Layman et al. | 250/492.21 |
| 4,745,287 | 5/1989 | Turner | 250/492.21 |
| 4,831,270 | 5/1989 | Weisenberger | 250/492.21 |
| 4,986,715 | 1/1991 | Asahawa | 414/331 |
| 5,004,924 | 4/1991 | Imahashi | 250/442.11 |
| 5,064,337 | 11/1991 | Asahawa | 414/639 |

FOREIGN PATENT DOCUMENTS 0211292 2/1987 European Pat. Off. .

OTHER PUBLICATIONS

Nuclear Instruments and Methods in Physics Research/Section B, vol. B21, No. 2-4, Mar. 1987, pp. 224–228, C. Taylor et al., "200 mm End Station for Ion Beam Implanters".

Primary Examiner—Bruce C. Anderson
Attorney, Agent, or Firm—Oblon, Spivak, McClelland, Maier & Neustadt

[57] ABSTRACT

Load lock chambers having a function of detecting positional deviation of wafers are provided in a process chamber of an ion injection apparatus, two on a carrying-in side, and two on a carrying-out side. One load lock chamber on the carrying-in side and one on the carrying-out side are used as a standby. Carrying-in carrying-out members and are outside of the process chamber. Two transfer members are in the process chamber. A dummy wafer stage is formed at a position which can be accessed by the transfer members. Wafers are transferred from load stages by the carrying-in member via the load lock chambers to the process chamber through a double operation line. Loading a wafer on the turn table and unloading a wafer therefrom can be performed simultaneously by operations of the transfer members and. The wafers are similarly carried out of the apparatus in a double operation line. At this time, dummy wafers in the process chamber can be used, if necessary.

20 Claims, 4 Drawing Sheets

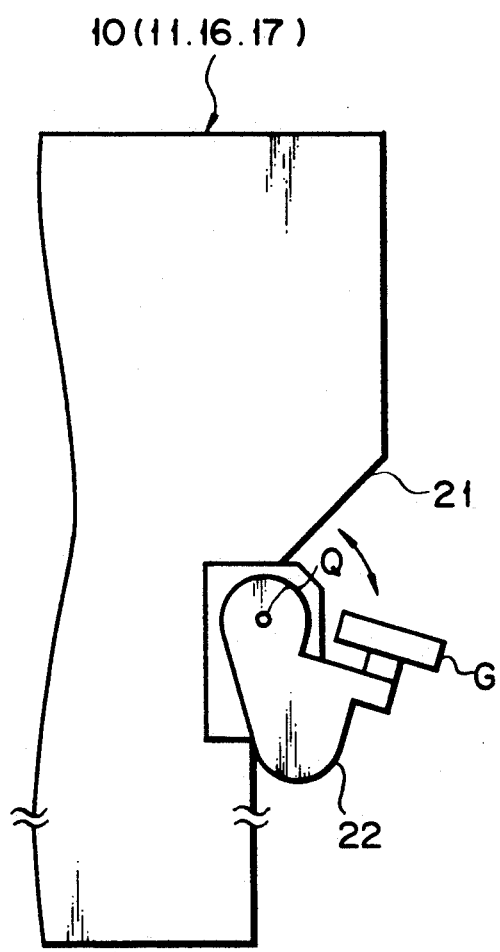
F I G. 2

PROCESSING SYSTEM

BACKGROUND OF THE INVENTION

1. Field of the Invention

This invention relates to a processing system having an improved mechanism for transferring objects such as semiconductor wafers.

2. Description of the Related Art

FIG. 3 shows an example of an ion injecting apparatus in which ions generated by an ion generator I in a terminal unit T are turned by an analysis magnet M and pass through an accelerating tube A. Then, the ions are successively injected into a plurality of wafers W placed on a turn table 1a (which is positioned vertically during an ion injection process) located in a process chamber 1.

The wafers, which are supplied from an external device, must be placed at exactly the right positions on the turn table 1a. For example, as shown in FIG. 4, wafers W are transferred one by one from a carrier 3 placed at a predetermined position outside the process chamber 1 by a transfer robot R1 to a positioning apparatus OD, according to conventional art. The positioning apparatus OD detects the orientation and the center of each wafer. If the orientation and/or the center is found to deviate from the correct one, the positioning apparatus OD corrects the position of the wafer by, for example, two steps: correcting the orientation and the correcting the central position. Thereafter, the wafers W are transferred from the positioning apparatus OD by the transfer robot R1 to a load lock chamber 2, a vacuum is created in the chamber 2, and the wafers are subsequently transferred therefrom to the turn table 1a by a transfer robot R2 provided in the process chamber 1.

In addition to the apparatus shown in FIG. 4, various other apparatuses and methods can be employed to batch-process wafers in a vacuum or in an atmosphere at low pressure. However, since it is difficult to transfer wafers between a vacuum and a non-vacuum state and since the unit of process (the number of wafers which can be processed at a time) differs from the unit of transfer (the number of wafers which can be held by a carrier at a time), the conventional wafer transfer apparatus has the following drawbacks:

1. It is difficult to achieve an interface between the wafer transfer apparatus and a wafer carrier distribution mechanism whereby the manufacturing process can be automated. Therefore, a special interface unit must be added, resulting in extra cost and a substantial length of time being required to correctly set up the apparatus.

2. Since a number of transfer steps are required and many of them include a wait time, wafers cannot be transferred quickly.

3. The order of transferring wafers is not suitable for keeping the main surfaces of the wafers clean. For example, if a wafer above another wafer is moved, dust may adhere to the main (upper) surface of the lower wafer.

4. Since the unit of process differs from the unit of transfer, wafer management is complicated. For example, when a processed wafer is stored in the wafer carrier, an operation of placing it back to the slot wherein the wafer is originally held is very troublesome.

5. Since wafers are transferred via a positioning apparatus, a relatively large number of transfer steps are required, thus increasing the possibility of wafer damage and/or particle contamination, and lowering the production yield. Further, the greater the number of handling steps, the longer is the transfer time, thus reducing the throughput of the apparatus.

SUMMARY OF THE INVENTION

The present invention has been developed in consideration of the above and its object is to provide a processing system having a high throughput, wherein objects are transferred quickly.

Another object of the present invention is to provide a processing system wherein an object can be handled with ease during output and input operations.

According to the present invention, there is provided a processing system comprising: a first casing defining a space in which the pressure is highly decreased and an object is processed; a second casing defining a space connected to the space defined by said first casing via a path through which the object is transferred, the pressure of the space defined by said second casing being highly decreased; a carrying-in opening formed in said second casing to allow the objects to be carried into said second casing; a carrying-out opening formed in said second casing and distinct from said carrying-in opening to allow the objects to be carried out of said second casing; a first load lock chamber, connected to said carrying-in opening and having a gate for opening and closing said carrying-in opening; a second load lock chamber, connected to said carrying-out opening and having a gate for opening and closing said carrying-out opening, said second load lock chamber defining a space which is controllable in pressure independently of a space defined by said first load lock chamber; first transfer means, mounted in said second casing, for transferring the objects from said first load lock chamber through said carrying-in opening to said second casing; second transfer means, mounted in said second casing, for transferring the objects from said second casing through said carrying-out opening to said second load lock chamber, said second transfer means being distinct from said first transfer means and able to operate independently of said first transfer means; a carrying-in port formed in said first load lock chamber so as to communicate with a space outside said first and second casing, said carrying-in port being opened and closed by a gate; carrying-in means for carrying the objects into said first load lock chamber through said carrying-in port; a carrying-out port formed in said second load lock chamber so as to communicate with a space outside said first and second casings, said carrying-out port being opened and closed by a gate; and carrying-out means for carrying out the objects from said second load lock means through said carrying-out port.

By virtue of the present invention, receiving of an object to be processed and transferring of an object which has been processed can be performed simultaneously. As a result, objects can be continuously transferred through an input line and an output line. Further, a double operation line can be easily attained by using, for example, two load lock chambers. Thus, the transfer speed can be increased.

If deviation of an object can be detected within a load lock chamber itself, there is no need for a separate, external, positioning apparatus as in the conventional art. As a result, damage or particle contamination of an object can be reduced, and the overall system made more compact.

If a storage section for storing a dummy object is formed in the process chamber, it is not necessary to transfer a dummy object from a stage to a loading stage and convey it into the process chamber via the load lock chamber. By virtue of this feature also, throughput can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a diagram showing a side view of a portion of the load lock chamber shown in FIG. 1;

DETAILED DESCRIPTION OF THE PREFERRED EMBODIMENT

Figure 1:
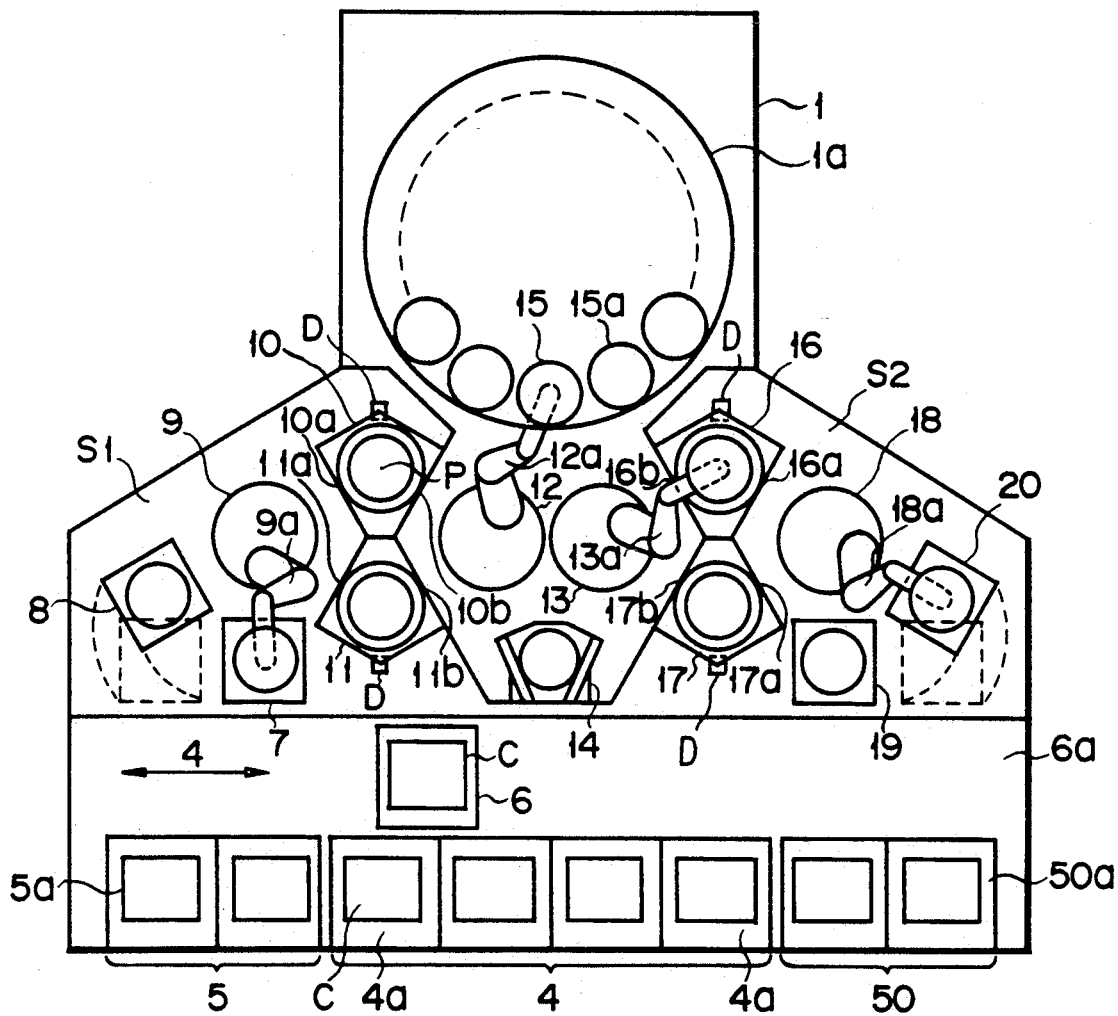
FIG. 1 is a schematic diagram showing a plan view of a processing system according to an embodiment of the present invention.

An embodiment of the present invention will now be described, with reference to FIG. 1. The system of this embodiment comprises a carrier input/output port 4 for transferring a wafer carrier C between the system and an operator or a transferring car for carrying the wafer carrier C. The carrier input/output port 4 has four carrier stages 4a arranged in a line, so as to transfer four carriers at most. An input carrier buffer 5 and an output carrier buffer 50 are formed on either side of the input/output port 4 to temporarily store the carrier C. The carrier buffers 5 and 50 have two carrier stages, 5a and 50a, respectively.

The carrier C has U-shaped slots and is able to hold 25 wafers as objects to be processed. In this embodiment, the carrier C on each of the stages 4a, 5a, and 50a is arranged such that the wafers stand vertically. However, it may be arranged so that the wafers are positioned horizontally one on another. The carrier C is always kept in an atmosphere to which pure air is supplied from an air supplying device having an HEPA filter.

A path 6a is formed along the stage line consisting of the input/output port 4 and the carrier buffers 5 and 50. A traverser 6 for transferring the carrier C moves in the path 6a. The traverser 6 is capable of moving along the longitudinal axis of the path 6a, rising the carrier perpendicular to the plane of the drawing, and moving the carrier C perpendicular to the longitudinal axis of the path 6a to place the carrier C on carrier stages. The traverser 6 is movable freely from one stage to another among 12 stages, i.e., the eight carrier stages 4a, 5a, and 50a, two loading stages in a carrying-in area S1 (to be described below) and two unloading stages in a carrying-out area S2 (to be described below).

The carrying-in area S1 and the carrying-out area S2 face the stage line with the path 6a therebetween. A process chamber 1 is arranged between the carrying-in area S1 and the carrying-out area S2. The carrying-in area S1 includes two loading stages 7 and 8 on which the carrier C is placed to withdraw wafers from the carrier C1, and a carrying-in member 9.

The loading stage 7 is fixed in a position which the traverser 6 and the carrying-in member 9 can access. On the other hand, the loading stage 8 is rotatably movable between a position in which the loading stage 8 receives the wafer carrier from the traverser 6 and a position in which the carrying-in member 9 withdrawn wafers from the wafer carrier, since these positions do not coincide with each other. The wafer carrier is placed on the loading stages 7 and 8 in a manner that the U-shaped opening thereof faces the carrying-in member 9 and wafers in the wafer carrier are positioned horizontally.

The carrying-in member 9 comprises, for example, a horizontal articulated robot arm 9a having chuck at its distal end. The carrying-in member 9 is capable of moving in three directions, i.e., rotating, extending/contracting, and going up/down, or two directions, i.e., rotating and extending/contracting, to transfer wafers between the loading stages 7 and 8 on one hand and load lock chambers (to be described below) on the other.

Two load lock chambers 10 and 11 are interposed between the carrying-in area S1 and the process chamber 1 for performing, for example, ion injection. In this embodiment, the load lock chambers 10 and 11 hold one wafer each. Each of load lock chambers 10 and 11 comprises a gate on the atmosphere side, a gate on the process chamber side, and a vacuum pump (not shown). A deviation detecting member D is incorporated in each load lock chamber, and detects the degree of positional deviation of a wafer, i.e., deviation of the angle of rotation and deviation of the center.

The degree of positional deviation of a wafer is detected as follows. For example, a wafer is rotated horizontally by a rotational member. A laser beam is applied perpendicular to the surface of the wafer, so that the distance between the periphery and the center of the rotation can be detected. The distance is detected for every rotational position, thereby detecting the degree of positional deviation. However, according to the present invention, the degree of positional deviation can be detected by other methods, for example, by using an image picked up by a TV camera.

At least one of the load lock chambers 10 and 11 may be a type of chamber which can hold a plurality of wafers as a batch, for example 25 wafers like the carrier. In a case that a plurality of wafers are held by a load lock chamber and positional deviation of these wafers is to be detected, the wafer carrier is engaged with an elevating member and set such that it does not collide with a turn table in the load lock chamber when it is lowered. The carrier holding the wafers is intermittently lowered and the wafers are rotated by the turn table one by one in order from the bottom, to detect the positional deviation. Thereafter, the wafers are sequentially output from the load lock chamber. In this case, for example, an optical unit for detecting the periphery of a wafer must move between the inside and the outside of the path 6a.

Positional deviation of a wafer is corrected as follows in this embodiment. Deviation of an angle of rotation (direction of the orientation flat) is corrected by rotating the wafer by rotational shafts of the load lock chambers 10 and 11. Deviation of the center is corrected by a first transfer member 12 by adjusting the amount of extension and contraction of a first transfer member 12 when it receives the wafer. However, the deviation of the angle of rotation may be corrected by the first transfer member, or both of the deviation of the angle of rotation and the deviation of the center may be corrected in the load lock chambers 10 and 11.

The process chamber 1 includes the first transfer member 12 and a second transfer member 13. The first and second transfer members 12 and 13 have the same structure as the carry-in member 9 described above, i.e., these member respectively comprise horizontal articulated robot arms 12a and 13a. These members are capable of rotating and extending/contracting. The process chamber 1 includes a dummy wafer stage 14 on which dummy wafers are placed. The dummy wafers are transferred to the turn table 1a as dummies. The turn table 1a has 25 (the same number as the wafers which can be held by the carrier C) wafer platens 15 arranged along the circumference. In an ion injection process, the table 1a is positioned vertically and is rotated so that the wafers in the platens are processed in order.

Positional relationships among the members and the configuration of the load lock chambers in this embodiment will now be described. The distance between the center P of the reference position of a wafer (the correct position of the wafer) in the load lock chamber 10 and the center of rotation of the carrying-in member 9 outside the process chamber is equal to the distance between the center and the center of rotation of the P first transfer member 12. This relationship also applies to the load lock chamber 11. The center of the dummy wafer stage 14 is apart from the center of rotation of the first transfer member 12 by the same distance as above. However, it is not necessary to equalize the distances as far as the members 9 and 12 can access the chambers 10 and 11. The gates on the atmosphere side face the carrying-in member 9 such that the longitudinal axes thereof cross each other at an angle less than 180°. The gates on the process chamber side face the first transfer member 12 in the same manner. In short, ports 10a, 10b, 11a, and 11b, on which the gates of the load lock chambers 10 and 11 are provided, are arranged as shown in FIG. 1. With this structure, since the carrying in member 9 and the transfer member 12 can be arranged close to the load lock chambers 10 and 11, the overall system can be compact. The positional relationships and the configuration o the load lock chambers in the carrying-out area are the same as described above. Ports 16a, 16b, 17a, and 17b are arranged as shown in FIG. 1.

The first transfer member 12 transfers wafers from the load lock chambers 10 and 11 to wafer platens 15 on the turn table 1a. The transfer member 12 also transfers dummy wafers from the dummy wafer stage 14 to the wafer platens 15. In this operation, each dummy wafer can be transferred either directly to the platen 15 or via the load lock chamber 10 or 11, wherein the deviation of each dummy wafer is corrected, to the platen 15.

The second transfer member 13 transfers wafers from the wafer platen 15 to load lock chambers 16 and 17 having buffers (to be described below). If a dummy wafers is placed on the wafer platen 15, the transfer member 13 returns them to the dummy wafer stage 14.

The carrying out load lock chambers 16 and 17 are mounted between the process chamber 1 and the carrying-out area S2. Each of the load lock chambers 16 and 17 includes a buffer constituted by a wafer carrier capable of holding wafers of the same number as those which can be held by the wafer carrier C. Each load lock chamber comprises a gate communicating with the atmosphere, a gate communicating with the process chamber side, and a vacuum pump. At least one of the load lock chambers 16 and 17 may be a type of chamber for holding one wafer.

A carrying out member 18 and unloading stages 19 and 20 are mounted in the carrying-out area S2. The carrying-out member 18 has, for example, the same structure as the carrying-in member 9. In other words, it comprises a horizontal articulated robot arm 18a, and is capable of rotating and extending/contracting. The carrying-out member 18 transfers wafers from the load lock chambers 16 and 17 to the unloading stages 19 and 20. A wafer carrier holding processed wafers is placed on the unloading stages 19 and 20.

The unloading stage 19 is fixed in a position which the carrier traverser 6 and the carrying-out member 18 can access. On the other hand, the unloading stage 20 is rotatably movable between a position in which the unloading stage 20 receives the wafer carrier from the traverser 6 and a position in which the carrying-out member 18 inserts the wafer to the unloading stage 20, since these positions do not coincide with each other. The wafer carrier is paced on the unloading stages 19 and 20 in a manner that the U-shaped opening thereof faces the carrying-out member 18.

In this embodiment, the elements of the carrying-in area S1 and those of the carrying-out area S2 are symmetrical with respect to the treatment chamber 1. In the treatment chamber, the two transfer members are arranged in symmetrical fashion. Therefore, the overall system is symmetrical.

An operation of the above embodiment will now be described. Wafers which are to be processed by the system of the present invention are transferred in one lot constituted by two carriers each holding 25 wafers by a wafer carrier transfer robot (not shown). The wafer carriers are loaded on the two carrier stages 4a positioned on the side near the carrying-in area S1 (the left side of the drawing) of the carrier input/output port 4 which is provided as a carrier input/output section of the present system. By virtue of the four carrier stages 4a of the carrier input/output port 4, one lot consisting of two carriers holding processed wafers are transmitted to the wafer carrier transfer robot via two carrier stages 4a positioned on the side near the carrying-out area S2 (the right side of the drawing), the moment the present system receives the one lot consisting of two carriers from the transfer robot. The transmitting operation and the receiving operation do not interfere with each other.

The carrier C received by the carrier input/output port 4 is transferred by the carrier traverser 6 to either the loading stage 7 or 8. If neither the loading stage 7 nor 8 is vacant, the carrier C is transferred to the carrier stage 5a of the input carrier buffer 5 on the left side of the drawing. Then, when the loading stage 7 or 8 becomes vacant, the carrier is transferred thereto by the carrier traverser 6.

The carrying-in member 9 withdraws wafers out of the carrier C placed on the loading stage 7 or 8, one by one in order from the lowest slot. The wafers are alternately carried into the load lock chambers 10 and 11 arranged, for example, horizontally. When the load lock chambers 10 and 11 receive wafers, the gates communicating with the atmosphere are closed so that a vacuum is created therein. At the same time, positional deviation of wafers is detected.

After a vacuum is created in the load lock chambers 10 and 11, the gates communicating with the processes chamber side are opened. The wafers are taken out of the load lock chambers and loaded into the wafer platens 15 on the turn table 1a by the first transfer member 12. When the first transfer member 12 receives a wafer, it is controlled so as to correct the deviation of the wafer on the basis of the positional deviation data detected by the load lock chambers 10 and 11.

The turn table 1a rotates, for example, clockwise upon reception of a wafer. This operation is repeated until all of the wafers are loaded onto the wafer platens 15. If the number of the wafers is less than that of the patens 15, dummy wafers which have been placed on the dummy wafer stage 14 in the process chamber 1 are transferred by the first transfer member 12 to the wafer platens 15. In this operation, the dummy wafers can be transferred either directly to the platens 15 or via the load lock chamber 10 or 11, wherein the deviation of the wafers is corrected, to the platens 15. Wafers which have been processed on the turn table 1a are taken out by the second transfer member 13 in a position 15a shown in FIG. 1, adjacent to the position where a wafer is loaded on the table, while a wafer is loaded on the wafer platen. The wafers may be take out in the position where a wafer is loaded. The wafers are taken out in the order in which they were loaded on the platen. The wafers are inserted into the buffers (not shown) in the load lock chambers 16 and 17 such that the wafers are placed one by one from the top. Each buffer is capable of holding wafers of the number as many as that can be held by the wafer carrier C. When one of the load lock chambers 16 and 17 is full of wafers, the other load lock chamber is used. At this time, the used dummy wafers are returned to the dummy wafer stage 14 by the second transfer member 13.

As soon as a load lock chamber is full of the wafers, the gate communicating with the process chamber 1 is closed and the pressure therein is returned to the atmospheric pressure. Then, the gate communicating with the atmosphere is opened. Thereafter, the wafers in the load lock chamber are taken out one by one in ascending order from the lowest slot, and returned to the wafer carrier placed on the unloading stage 19 or 20. A wafer carrier which has become vacant in the loading stage 7 or 8 is transferred by the traverser 6 to the unloading stage 19 or 20, so that the processed wafers are returned to the same carrier which has been used to transfer the wafers into the process chamber. The carriers, on which the wafers are returned, are successively transferred outside the system by the carrier traverser 6 from the unloading stages 19 and 20. If necessary, the carrier is temporarily loaded on the carrier stage 50a in the output carrier buffer 50, and then a lot consisting of two carriers is transferred to the carrier transfer robot (not shown) through the carrier input/output port 4.

The order of withdrawing wafers in each process of the above embodiment will now be described. First, the wafers are withdrawn from the loading stages 7 and 8, which have received the carrier C from the input/output port 4, in ascending order from the lowest slot, and loaded into the load lock chambers 10 and 11 in the carrying-in area. The wafers are housed in the load lock chambers 10 and 11 one by one. Then, the wafers on the turn table 1a of the process chamber 1 are handled in a first-in-first-out manner. Thus, the order of arrangement of the wafer is not inverted.

Each of the load lock chambers 16 and 17 on the carrying-out area is capable of holding wafers as many as those which the carrier C can hold. Wafers are inserted in the load lock chambers 16 and 17 from the top and withdrawn from the bottom, thereby inverting the order of arrangement. Accordingly, with regard to the load lock chambers 16 and 17, the wafer in the bottom slot, which has been withdrawn last from the load lock chambers 10 and 11 in the carrying-in area, is withdrawn first. The carrier from which the wafers have been withdrawn in the loading stage 7 or 8 is transferred by the traverser 6 to the unloading stage 19 or 20. The wafers withdrawn out of the load lock chambers 16 and 17 are loaded into the corresponding carrier C in descending order from the top slot. Thus, the wafers are returned to the carrier by which they have been carried into the system in the same order as originally loaded. This is advantageous in managing wafers in lots.

If a load lock chamber having a buffer for holding a plurality of wafers is used as the load lock chamber 10 or 11, lot management can be easily achieved by using a buffer capable of holding wafers as many as those which can be held by the turn table 1a, and by means of the following steps: first, the wafers are withdrawn from the carrier C on the loading stage 7 or 8 in ascending order from the lowest slot. They are loaded onto the buffer of the load lock chamber 10 or 11 in descending order from the top slot, and withdrawn in the order from the bottom.

Thereafter, the direction of rotating the turn table 1a is inverted in loading and unloading operations, thereby inverting the order of the wafers in batches. For example, the first and second transfer members 12 and 13 access the turn table 1a in the position 15, and the turn table 1a is rotated counterclockwise in a loading operation and clockwise in an unloading operation. The wafers on the turn table 1a are inserted in the buffers of the load lock chambers 16 ad 17 in the carrying-out area in descending order from the top slot, and withdrawn therefrom in ascending order from the lowest slot, thereby inverting the order of the wafers. As a result, the wafer in the top slot, which has been withdrawn last from the carrier C in the loading stage 7 or 8, is withdrawn first from the load lock chamber 16 or 17. The carrier C which has become vacant in the loading stage 7 or 8 is transferred by the traverser 6 to the unloading stage 19 and 20. The wafers withdrawn from the load lock chamber 16 or 17 are inserted in the carrier C in descending order from the top slot. Thus, the wafers are returned to the carrier by which they have been carried into the system in the same order as originally loaded. This is advantageous in managing wafers in lots.

With the above-described structure and operation, it is unnecessary to provide a special interface between the present system and another distributing mechanism. In addition, since wafers are inserted in the carrier in descending order and withdrawn therefrom in ascending order, no wafer exists below the wafer which is currently handled. Therefore, wafers are kept clean.

Figure 3:
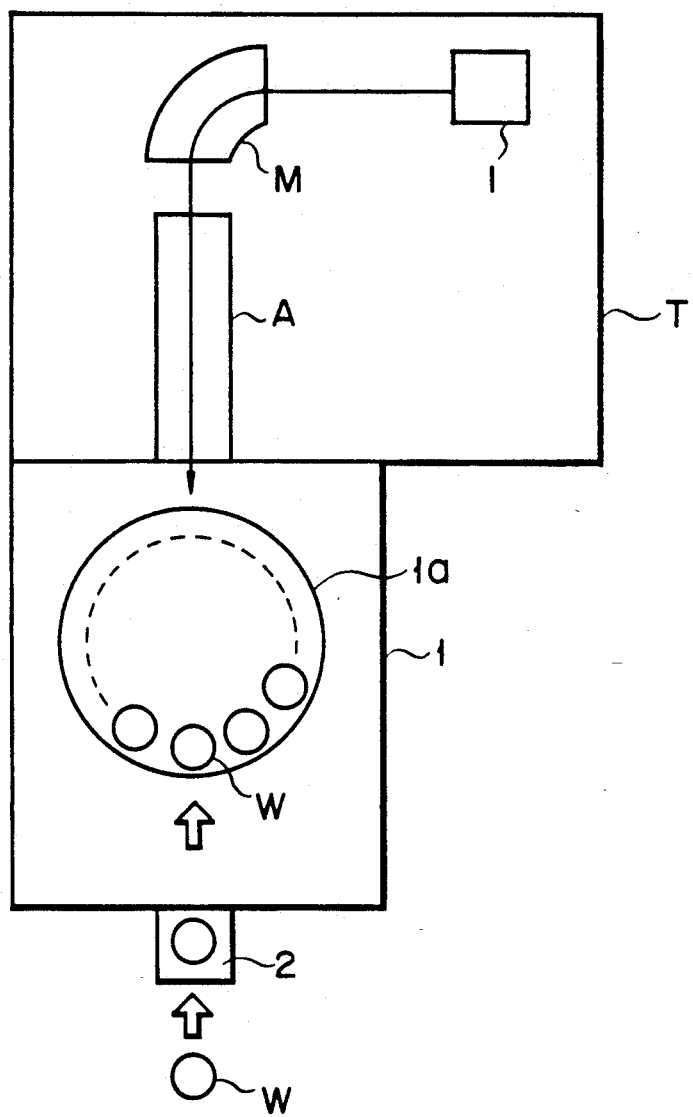
FIG. 3 is a schematic diagram showing a view of the overall structure of a conventional ion injection apparatus.
Figure 4:
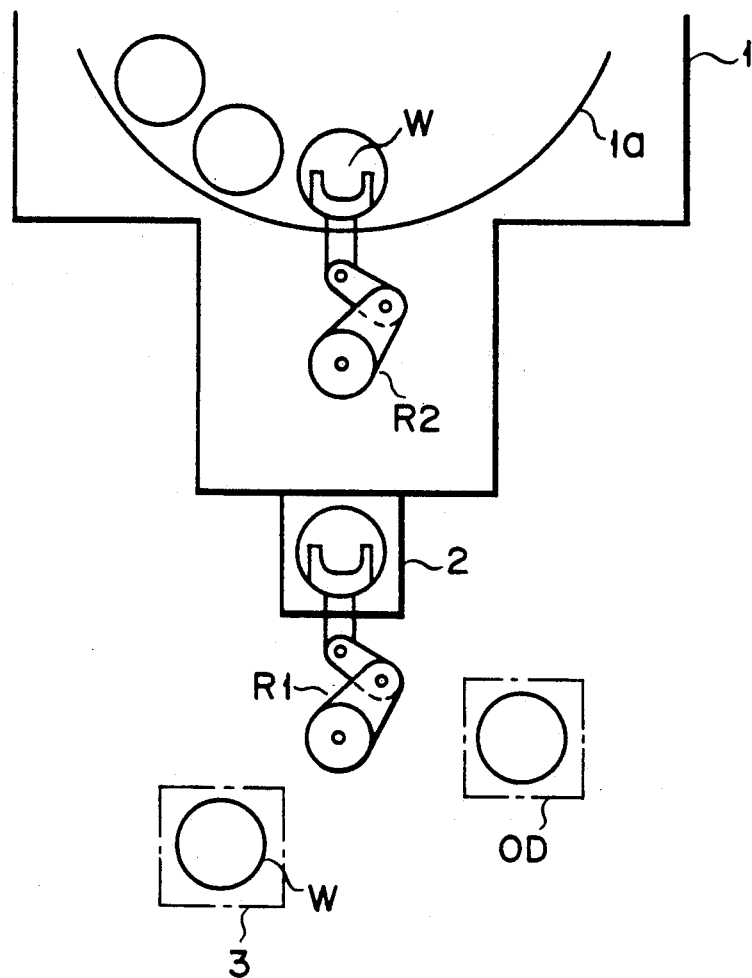
FIG. 4 is a schematic diagram showing a conventional wafer transferring apparatus.

In the above embodiment, when a predetermined number of wafers are placed on the turn table 1a, the turn table 1a is stood vertically. Then, ions are injected into the wafers by a terminal unit, such as the terminal unit T shown in FIG. 3. In this embodiment, the transfer area where the transfer members 12 and 13 are arranged is in a common atmosphere to the process area where the turn table 1a is arranged.

The above embodiment is further advantageous in the following respects. The carrier input/output port 4 has two distinct carrier stages 4a, i.e., the carrier stage 4a for receiving a carrier transferred by the transfer robot from the external device, and the carrier stage 4a for carrying a carrier holding wafers which have been processed by the present system to outside. Therefore, the carrier robot can receive a carrier C holding processed wafers immediately after transmitting a carrier C to the system from outside. Further, since the present system has the buffer stages 5a and 50a, it can temporarily store carriers C, unless the transfer robot works timely with the present system.

Moreover, since two loading stages and two unloading stages are provided, upon completion of transferring wafers to or out of a carrier on one stage, a carrier on the other stage can be handled immediately. In this way also, an unnecessary wait time is reduced, thereby increasing the wafer transfer speed.

FIG. 2 shows the structure of the gates of the load lock chambers 10, 11, 16 and 17. The wafer port is formed on a plane 21 which forms an angle of 45° with the vertical axis of the chamber. A gate G for opening and closing the port is attached to a rotational member 22 which rotates on a horizontal axis Q. Thus, since the gate G does not move laterally, and moves within only a small range, it requires only a small space. The gate G may be moved vertically, instead of rotating.

If the carrying-in area and the carrying out area include two load lock chambers each as in the above embodiment, one can be used in a wafer-input operation while the other can be used in a wafer-output operation. The number of the load lock chambers is not limited to two, but may be one, three, or more.

If each of the carrying-in and carrying-out areas include a load lock chamber having a positional deviation detecting member, the reduction of the process efficiency due to malfunction can be suppressed to minimum. Because, if malfunction occurs in the carrying-in area, the direction of wafer distribution can be reversed, thereby making use of the positional deviation detecting member in the carrying-out area.

The positional deviation detecting member need not necessarily be incorporated in load lock chambers, but may be arranged in a position which can be accessed by the carrying-in member 9 located outside the process chamber.

Further, this embodiment is advantageous in that the transfer steps can be controlled easily, since the system is symmetrized and the traverser 6 moving between the carrying-in and carrying-out areas S1 and S2 is used. However, the system need not necessarily be symmetric.

The present invention can also be applied to a case wherein wafers are transferred between different gas atmospheres, as well as between different pressure atmospheres as described in the embodiment.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A wafer processing system, comprising:
   a first casing defining a first space in which the pressure is greatly decreased and a wafer is processed;
   a mount member arranged in the first casing for supporting the wafer;
   a second casing defining a second space connected to the first space by a path through which the wafer is transferred, the pressure in the second space being greatly decreased;
   a pair of carrying-in openings formed in the second casing to allow the wafer to be carried into the second casing;
   a pair of carrying-out openings formed in the second casing and distinct from the carrying-in openings, to allow the wafer to be carried out of the second casing;
   a pair of first load lock chambers, each connected to one of said pair of carrying-in openings and each having a gate for opening and closing one of said pair of carrying-in openings;
   a pair or second load lock chambers, each connected to one of said pair of carrying-out openings and each having a gate for opening and closing one of said pair of carrying-out openings, each of said load lock chambers of said first and second pairs of load lock chambers defining a space in which a pressure therein is independently controllable;
   a first transfer member arranged in the second casing, for transferring the wafer from one of said pair of first load lock chambers through one of said pair of carrying-in openings onto the mount member, the first transfer member being rotatable to selectively face said one of said pair of first load lock chambers and the mount member;
   a second transfer member arranged in the second casing, for transferring the wafer form the mounted member through one of said pair of carrying-out openings into one of said pair of second load lock chambers, the second transfer member being rotatable to selectively face said one of the second load lock chambers and the mount member, and being distinct from and able to operate independently of the first transfer member;
   a pair of carrying-in ports, one formed in each of said pair of first load lock chambers so that said pair of first load lock chambers communicate with a space outside the first and second casings, each of said pair of carrying-in ports being opened and closed by a respective gate;
   carrying-in means for carrying the wafer into said one of said pair of first load lock chambers through one of said pair of carrying-in ports;
   a pair of carrying-out ports, one formed in each of said pair of second load lock chambers so that said second pair of load lock chambers communicate with a space outside the first and second casings, each of said pair of carrying-out ports being opened and closed by a respective gate; and
   carrying-out means for carrying out the wafer from one of said pair of second load lock chambers through one of said pair of carrying-out ports.

2. The wafer processing system according to claim 1, wherein the carrying-in means and carrying-out means respectively comprise a carrying-in member and a carrying-out member, the carrying-in member being rotatable to selectively face one of said pair of first load lock chambers, and the carrying-out member being rotatable to selectively face one of said pair of second load lock chambers.

3. The wafer processing system according to claim 2, further comprising a pair of loading stages and a pair of unloading stages arranged in a space outside the first and second casings, with a container mounted on each of said pair of stages for storing a plurality of wafers to be processed, wherein the carrying-in member takes the wafer out of said pair of containers of the loading stages, and the carrying-out member transfers the wafers into said pair of containers of the loading stages.

4. The wafer processing system according to claim 3, further comprising an outside transfer apparatus for transferring the containers between the loading and unloading stages.

5. The wafer processing system according to claim 4, wherein one of said pair of loading stages is movable between a position near the carrying-in member and a position near the outside transfer apparatus, and one of said pair of unloading stages is movable between a position near the carrying-out member and a position near the outside transfer apparatus.

6. The wafer processing system according to claim 2, wherein the pair of first load lock chambers are arranged to be the same distance from a rotational center of the carrying-in member, and first and second side walls of the first load lock chambers, on which the pair of carrying-in ports are respectively formed, are arranged to form an angle less than 180° and, the pair of second load lock chambers are arranged to be the same distance from a rotational center of the carrying-out member, and third and fourth side walls of the second load lock chambers, on which the pair of carrying-out opening are respectively formed, are arranged to form an angle less than 180°.

7. The wafer processing system according to claim 3, wherein the system in arranged in symmetrical fashion between a carrying-in side and a carrying-out side, and the carrying-in and carrying-out sides are reversible in function.

8. The wafer processing system according to claim 7, wherein each of said pair of first load lock chambers includes a detecting means for detecting a positional deviation of the wafer, and the first transfer member changes the position at which the wafer is supported during transfer with reference to the positional deviation detected by one of said detecting means of said pair of first load lock chambers, and each of said pair of second load lock chambers includes a detecting means for detecting a positional deviation of the wafer, and the second transfer member changes the position at which the wafer is supported during transfer, with reference to the positional deviation detected by one of said detecting means of said pair of second load lock chambers.

9. The wafer processing system according to claim 1, wherein the pair of first load lock chambers are arranged to be the same distance from a rotational center of the first transfer member, and first and second side walls of the second casing, on which the pair of carrying-in openings are respectively formed, are arranged to form an angle less than 180°, and the pair of second load lock chambers are arranged to be the same distance from a rotational center of the second transfer member, and third and fourth side walls of the second casing, on which the pair of carrying-out openings are respectively formed, are arranged to form an angle less than 180°.

10. The wafer processing system according to claim 1, wherein the mount member supports a plurality of wafers to be processed at a time.

11. The wafer processing system according to claim 10, further comprising a storage section, arranged in the second casing, for storing a dummy wafer which is to be placed on the mount member, wherein the rotational centers of the first and second transfer members are arranged to be the same distance from the storage section, and the first transfer member transfers the dummy wafer from the storage section onto the mount member, and the second transfer member transfers the dummy wafer from the mount member into the storage section.

12. The wafer processing system according to claim 11, wherein the storage section and the pair of first load lock chambers are arranged to be the same distance from the rotational center of the first transfer member, and the storage section and the pair of second load lock chambers are arranged to be the same distance from the rotational center of the second transfer member.

13. The wafer processing system according to claim 12, wherein the mount member comprises a rotatable mount on which the wafer are mounted side by side.

14. The wafer processing system according to claim 13, wherein the first casing comprises a process chamber for ion injection, and the first and second casings contain a common atmosphere.

15. The wafer processing system accord to claim 1, wherein the first load lock chamber includes:
   detecting means for detecting positional deviation of the wafer; and
   the first transfer member changes the position at which the wafer is supported during transfer, with reference to a positional deviation of the wafer detected by the detecting means.

16. A wafer processing system, comprising:
   a first casing defining a first space in which the pressure is greatly decreased and a plurality of wafers are processed;
   a mount member arranged in the first casing for supporting the wafers;
   a second casing defining a second space connected to the first space via a path through which the wafers are transferred, the pressure in the second space being greatly decreased;
   a carrying-in opening formed in the second casing to allow the wafers to be carried into the second casing;
   a carrying-out opening formed in the second casing and distinct from the carrying-in opening, to allow the wafers to be carried out of the second casing;
   a first load lock chamber connected to the carrying-in opening and having a gate for opening and closing the carrying-in opening;
   a second load lock chamber connected to the carrying-out opening and having a gate for opening and closing the carrying-out opening, each of said first and second load lock chambers defining a space in which the pressure is independently controllable;
   a first transfer member arranged in the second casing, for transferring the wafers from the first load lock chamber through the carrying-in opening onto the mount member, the first transfer member being rotatable to selectively face the first load lock chamber and the mount member;

a second transfer member arranged in the second casing, for transferring the wafers from the mount member through the carrying-out opening into the second load lock chamber, the second transfer member being rotatable to selectively face the second load lock chamber and the mount member, and being distinct from and able to operate independently of the first transfer member;

a storage section, arranged in the second casing, for storing a dummy wafer which is to be placed on the mount member, wherein rotational centers of the first and second transfer members are arranged to be the same distance from the storage section, and the first transfer member transfers the dummy wafer from the storage section onto the mount member, and the second transfer member transfers the dummy wafer from the mount member into the storage section;

a carrying-in port formed in the first load lock chamber so that the first load lock chamber communicates with a space outside the first and second casing, the carrying-in port being opened and closed by a gate;

carrying-in means for carrying the wafers into the first load lock chamber through the carrying-in port;

a carrying out port formed in the second load lock chamber so that the second load lock chamber communicates with a space outside the first and second casings, the carrying-out port being opened and closed by a gate; and carrying-out means for carrying out the wafers from the second load lock means through the carrying-out port.

17. The wafer processing system according to claim 16, wherein the storage section and the first load lock chamber are arranged to be the same distance from the rotational center of the first transfer member, and the storage section and the second load lock chamber are arranged to be the same distance from the rotational center of the second transfer member.

18. The wafer processing system according to claim 17, wherein the mount member comprises a rotatable mount on which the objects are mounted side by side.

19. The wafer processing system according to claim 18, wherein the first casing comprises a process chamber for ion injection, and the first and second casings contain a common atmosphere.

20. The wafer processing system according to claim 17, wherein the system in arranged in symmetrical fashion between a carrying-in side and a carrying-out side, and the carrying-in and carrying-out sides are reversible in function.

* * * * *